US009069030B2

(12) United States Patent
Zula et al.

(10) Patent No.: US 9,069,030 B2
(45) Date of Patent: Jun. 30, 2015

(54) SYSTEM, CONTROLLER AND METHOD FOR TESTING A SOLENOID

(71) Applicants: Daniel P. Zula, North Ridgeville, OH (US); Kirit A. Thakkar, Parma, OH (US); Thomas J. Weed, North Ridgeville, OH (US); Julie A. Miller, Lorain, OH (US)

(72) Inventors: Daniel P. Zula, North Ridgeville, OH (US); Kirit A. Thakkar, Parma, OH (US); Thomas J. Weed, North Ridgeville, OH (US); Julie A. Miller, Lorain, OH (US)

(73) Assignee: Bendix Commercial Vehicle Systems LLC, Elyria, OH (US)

( * ) Notice: Subject to any disclaimer, the term of this patent is extended or adjusted under 35 U.S.C. 154(b) by 51 days.

(21) Appl. No.: 14/077,781

(22) Filed: Nov. 12, 2013

(65) Prior Publication Data
US 2015/0134216 A1    May 14, 2015

(51) Int. Cl.
*G01R 31/06*    (2006.01)
*B60T 8/17*    (2006.01)

(52) U.S. Cl.
CPC .. *G01R 31/06* (2013.01); *B60T 8/17* (2013.01)

(58) Field of Classification Search
CPC .................................. G01R 31/06; B60T 8/17
USPC ............................................................ 701/70
See application file for complete search history.

(56) References Cited

U.S. PATENT DOCUMENTS

| 3,709,567 | A | 1/1973 | Van Ostrom |
| 3,920,284 | A | 11/1975 | Lane |
| 4,078,631 | A * | 3/1978 | Kadota et al. ................. 180/179 |
| 4,481,554 | A | 11/1984 | Henricks |
| 4,700,304 | A | 10/1987 | Byrne |
| 6,019,441 | A | 2/2000 | Lloyd |
| 6,097,998 | A | 8/2000 | Lancki |
| 6,188,948 | B1 | 2/2001 | Shivler |
| 6,237,401 | B1 | 5/2001 | Haehn |
| 6,392,864 | B1 | 5/2002 | Tang |
| 7,699,409 | B2 | 4/2010 | Yamaguchi |
| 8,133,033 | B2 | 3/2012 | Abraham |
| 2008/0276824 | A1 * | 11/2008 | King et al. ...................... 105/50 |
| 2008/0276825 | A1 * | 11/2008 | King et al. ...................... 105/50 |
| 2008/0281479 | A1 * | 11/2008 | King et al. ...................... 701/22 |
| 2008/0288132 | A1 * | 11/2008 | King et al. ...................... 701/22 |

OTHER PUBLICATIONS

Bendix Commercial Vehicle System LLC, Bendix M-32 and M-32QR Antilock Modulators, Service Data Sheet, May 2004, 8 pages, Bendix Commercial Vehicle Systems LLC, Elyria Ohio U.S.A.

International Searching Authority, International Search Report and Written Opinion, Mar. 31, 2015, 17 pages, ISA/US, United States.

* cited by examiner

*Primary Examiner* — Mary Cheung
*Assistant Examiner* — Frederick Brushaber
(74) *Attorney, Agent, or Firm* — Cheryl L. Greenly; Eugene E. Clair; Brian E. Kondas

(57) ABSTRACT

Various embodiments for determining a voltage rating of a solenoid in an electropneumatic valve are disclosed. A braking system controller comprises a power switch electrically connected to an associated first solenoid. The power switch provides a low current regulated voltage to the associated first solenoid. The current through the solenoid is converted to a voltage. The voltage is compared to a predetermined voltage range to determine the voltage rating of the associated first solenoid. In another embodiment, the control logic is capable of determining the voltage rating of multiple solenoids in each of the electropneumatic valves connected to the controller.

33 Claims, 2 Drawing Sheets

SYSTEM, CONTROLLER AND METHOD FOR TESTING A SOLENOID

BACKGROUND

The present invention relates to various embodiments of a system, controller and method for testing a solenoid. The solenoid may be one of a plurality of solenoids in an electropneumatic valve on a commercial vehicle. The electropneumatic valve includes at least one solenoid that responds to an electronic control signal by opening or closing a passage in the valve. Due to the high operating current requirements for solenoids, the control voltage for the electropneumatic valve operation is typically provided from a vehicle's battery through a controller. The electropneumatic valve has a voltage rating and the voltage rating indicates that the electropneumatic valve is compatible with a particular battery voltage value.

Commercial vehicles, such as trucks or tractors, may be equipped with a twelve volt battery system, a twenty-four volt battery system or another battery system. The battery system installed on the commercial vehicle depends on the commercial vehicle application and expected power usage.

Commercial vehicles equipped with an antilock braking system or an electronic stability control system typically have at least four electropneumatic valves connected to a braking system controller. The voltage rating of each electropneumatic valve is selected to be compatible with the battery system on the commercial vehicle in order to operate properly. In general, electropneumatic valves are packaged in nearly identical housings for ease in installation and, in most cases, the voltage rating of each electropneumatic valve can only be determined by the markings on a label. If the voltage rating of the electropneumatic valve is different than the voltage rating of the battery system on the commercial vehicle, the electropneumatic valve may not work or may partially actuate. During an antilock brake or automated brake application, the braking performance may be degraded.

Even if the electropneumatic valve has the same voltage rating as the commercial vehicle, the solenoids in the electropneumatic valve may incur a short circuit or an open circuit state due to faulty installation or extended use. The solenoid resistance may also degrade over time or be out of range due to a manufacturing defect or environmental factors. If the solenoid resistance is not within the specified values, the electropneumatic valve may not work or may partially actuate. During an antilock brake or automated brake application, the braking performance may be degraded.

The present invention provides a new system, controller and method which address the above referenced problems.

SUMMARY

Various embodiments of a controller for determining a voltage rating of an electropneumatic valve are disclosed. In one embodiment of the present invention, the controller comprises a battery power port, an isolating device electrically connected to the battery power port, a first power switch electrically connected to the isolating device, and a first high solenoid port electrically connected to the first power switch and an associated first solenoid. A low solenoid port is configured to electrically connect to the associated first solenoid and a voltage regulator is electrically connected to the ignition power port and the first high solenoid port. Control logic in the controller is in electrical communication with the voltage regulator, the first power switch and the isolating device. The control logic is capable of determining a voltage rating of the associated first solenoid. In another embodiment, the control logic is further capable of testing the associated first solenoid and determining at least one of an open circuit state, short circuit state or resistance out of range state of the associated first solenoid.

In accordance with another aspect, a method for determining a voltage rating of a solenoid for a braking system comprises receiving battery power at a battery power port of a controller and receiving a signal indicative of ignition power at the controller. The controller and associated control logic isolates the battery power from a first power switch upon receiving the signal indicative of ignition power, provides a regulated voltage based on the battery power at the first power switch, activates the first power switch to provide the regulated voltage to a first solenoid through a high solenoid port and receives a current through the first solenoid at a low solenoid port. The method comprises determining the voltage rating of the first solenoid based on the current received at a low solenoid port.

In accordance with another aspect, a system for determining a voltage rating of at least one solenoid comprises a controller electrically connected to a first solenoid, a battery power source and an input for receiving a signal indicative of ignition power. The controller comprises control logic capable of determining a voltage rating of the solenoid. The control logic isolates the battery power source from the first solenoid, provides a regulated voltage to the first solenoid in response to the signal indicative of ignition power and receives a current through the first solenoid. The control logic determines the voltage rating of the solenoid based on the received current.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to exemplify some embodiments of this invention. The drawings are not necessarily to scale.

DETAILED DESCRIPTION

Figure 1:
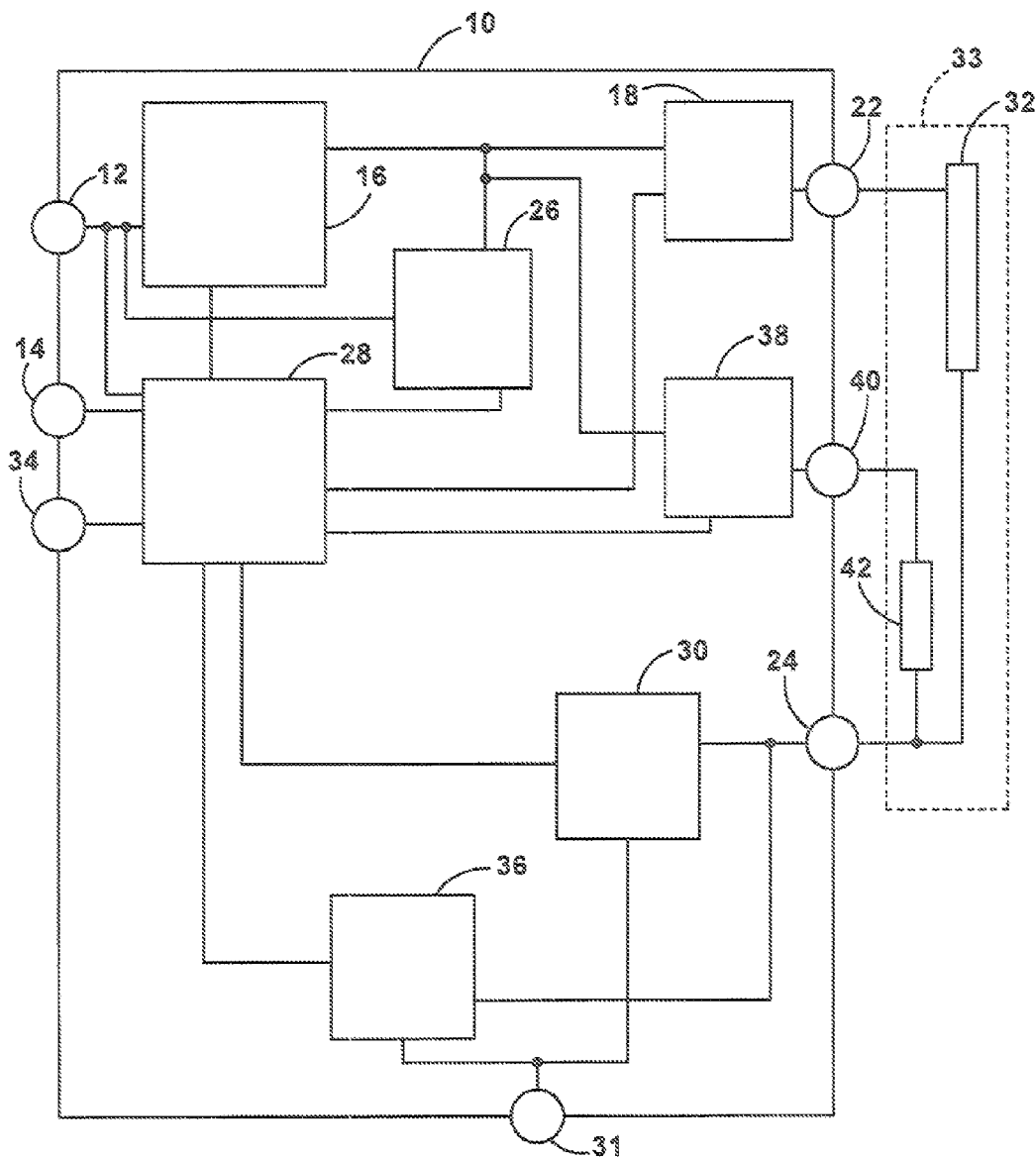
FIG. 1 illustrates a schematic representation of a system, according to an embodiment of the present invention.

With reference to FIG. 1, a controller 10 for use in a braking control system on a commercial vehicle is shown. The controller 10 is capable of determining a voltage rating of a solenoid 32 in an associated electropneumatic valve 33. If the voltage rating of the solenoid 32 is not within a predetermined voltage range, the controller 10 is also capable of determining an open circuit state, a short circuit state, or an out of resistance range state of the solenoid 32 of the electropneumatic valve 33.

The commercial vehicle includes a battery (not shown) electrically connected to the controller 10 at battery power port 12. The battery power port 12 is connected through a high current fuse (not shown) directly to the vehicle battery. The battery power port 12 is used to provide power to the high current devices controlled by the controller 10, such as the electropneumatic valve 33. Many commercial vehicles include a +12V direct current (DC) battery. Other commercial vehicles include a +24V DC battery or combination of batteries to power the vehicle systems, including the controller 10. A typical 12V battery could have an output ranging from 9V to 16V DC and a typical 24V battery could have an output ranging from 18V to 32V DC. The battery is susceptible to power line noise and electrical transients, affecting the actual voltage at the battery power port 12. Therefore, the controller 10 and the high current devices controlled by the controller 10 cannot rely on a precise, consistent voltage output from the battery. The controller 10 receives constant power through the battery power port 12. The controller 10 is designed to operate with one battery source so the vehicle manufacturer or repair technician must ensure that he correctly installs the controller 10 rated for the battery source on the vehicle. The controller 10 is generally installed on the vehicle at a different time in the manufacturing process than the electropneumatic valve 33.

A power source from the battery that is activated upon ignition of the vehicle is electrically connected to the controller 10 at ignition power port 14. The ignition power port 14 receives power from the battery upon driver activation of an ignition switch (not shown). This ignition power source is essentially subject to the same electrical transients and power line noise as the battery. Alternatively, the controller 10 receives a signal indicative of ignition power at the ignition power port 14 or by another means. The controller 10 includes a ground port 31. The ground port 31 is connected to an electrical ground external from the controller 10.

The controller 10 is connected to the electropneumatic valve 33 through a first high solenoid port 22 and a low solenoid port 24. An example of an electropneumatic valve is an M-32™ modulator available from Bendix Commercial Vehicle Systems LLC of Elyria, Ohio, USA. The electropneumatic valve 33 includes at least the first solenoid 32. The controller 10 is capable of determining the voltage rating, an open circuit state, a short circuit state or an out of resistance range state of the first solenoid 32 in the electropneumatic valve 33.

The controller 10 is rated for connection to either a +12V DC high current capability battery source or a +24V DC high current capability battery source. Each electropneumatic valve is rated for operation with a single type of controller, which in turn is rated for connection to one type of battery system. Connecting an electropneumatic valve in this manner obviates the need for a complex control method, such as pulse width modulation (PWM), to step down the voltage value. A PWM voltage regulation circuit adds cost to the controller and would increase electromagnetic emissions of the controller 10.

For example, an M-32 modulator rated for operation at 12V includes two solenoids with approximately 11.5 ohms resistance each. An M-32 modulator rated for operation at 24V includes two solenoids with approximately 30 ohms resistance each. The controller 10 may be connected to between four and seven M-32 modulator or other electropneumatic valves, therefore requiring between four amps and fourteen amps to operate all of the electropneumatic valves, if simultaneous operation is required during antilock or automated braking By determining, prior to operating the vehicle, that an electropneumatic valve rated for 24V operation is connected to a 12V controller, the valve can be exchanged at the vehicle manufacturer or garage in order to minimize vehicle downtime and potential damage to the electropneumatic valves and controller.

The controller 10 includes an isolating device 16 as part of the internal circuitry. The isolating device 16 is electrically connected to the battery power port 12. The isolating device 16 may be a relay, such as PCB (printed circuit board) relay part number V23072 from Tyco Electronics. The isolating device 16 may be another electrical means of isolating the battery power source from the rest of the circuit on the controller 10, such as a power switch. The isolating device 16 may be normally open, meaning the battery power is disconnection from the circuitry downstream of the isolating device 16 in the controller 10. When the isolating device 16 is activated and closed, the battery power is connected to the circuitry downstream of the isolating device 16.

The controller 10 includes a first power switch 18 for providing power to the first solenoid 32 of the electropneumatic valve 33. The first power switch 18 is electrically connected after the isolating device 16. When the first power switch 18 is activated and the isolating device 16 is closed, a path for power to flow from the battery to the first solenoid 32 through the isolating device 16 and the first high solenoid port 22 is created. The first power switch 18 may be a high side power switch, such as part number BTS5210L from Infineon Technologies AG.

In another embodiment, the controller 10 further include a ground power switch 36 electrically connected to the low solenoid port 24 for creating a path to ground via the ground port 31 when activated. The ground power switch 36 may be a low side power switch, such as part number BTS141 from Infineon Technologies AG. When both the first power switch 18 and the ground power switch 36 are activated, current travels through the first solenoid 32, thereby actuating the first solenoid 32. The first solenoid 32 is not actuated unless the first power switch 18 and the ground power switch 36 are both activated.

The controller 10 includes a voltage regulator 26, such as the TLE4254GA voltage tracking regulator from Infineon Technologies AG. The voltage regulator 26 provides a regulated voltage of approximately 5V to the first power switch 18 when activated. Alternatively, the voltage regulator 26 can be set to provide a regulated voltage that is lower than the battery voltage. The voltage regulator provides less than about 500 mA of current, which is adequate for testing the first solenoid 32 but not to actuate the first solenoid 32. The voltage regulator 26 is electrically connected to the first power switch 18 and the battery power port 12.

In another embodiment, the controller 10 optionally includes a converter 30. The converter 30 receives the current from the first solenoid 32 and converts the current to a voltage value proportional to the current. The converter 30 can be a combination of analog and digital circuit components and can include a current source and a current mirror configuration.

The controller 10 includes control logic 28 for determining the voltage rating of the first solenoid 32. The control logic 28 either receives the current directly or receives a voltage value from the converter 30. The control logic 28 compares the voltage from the converter 30 to a predetermined voltage range to determine the voltage rating of the first solenoid 32. The control logic 28 may be preprogrammed with the voltage rating of the controller 10 and can determine if the first solenoid 32 has the same voltage rating to the controller 10. The control logic 28 also includes a timer. The control logic 28 is connected to the battery power port 12, the ignition power port 14, the isolating device 16, the voltage regulator 26, the converter 30, the first power switch 18 and the ground power switch 36. The control logic 28 may also determine whether the first solenoid 32 is in an open circuit state, short circuit state or resistance out of range state.

The control logic 28 may include volatile, non-volatile memory, solid state memory, flash memory, random-access memory (RAM), read-only memory (ROM), electronic erasable programmable read-only memory (EEPROM), variants of the foregoing memory types, combinations thereof, and/or any other type(s) of memory suitable for providing the described functionality and/or storing computer-executable instructions for execution by the control logic 28. The memory may be used to store the preprogrammed voltage ranges for use in determining the voltage rating of the first solenoid 32. The memory may also be used to store preprogrammed voltage ranges for use in determining an open circuit state, short circuit state or resistance out of range state of the first solenoid 32.

In order to determine the voltage rating of the first solenoid 32, the control logic 28 deactivates the isolating device 16 and the ground power switch 36 so they are open. Then, the control logic 28 activates the first power switch 18 and deactivates the ground power switch 36. In this manner, the voltage regulator 26, the first power switch 18, the associated first solenoid 32, the converter 30 and the control logic 28 are in series. Since the ground power switch 36 is open, there is no direct path to the ground port 31.

In another embodiment, the controller 10 further includes a diagnostic output port 34. The diagnostic output port 34 is used by the control logic to transmit a diagnostic output signal from the controller 10 in response to the determination of the voltage rating of the first solenoid 32. The diagnostic output port 34 may be connected to a diagnostic display device (not shown) external from the controller 10.

In another embodiment, the controller includes a plurality of solenoids. In this embodiment, the controller 10 includes a second power switch 38 for providing power to a second solenoid 42 of the electropneumatic valve 33. The second power switch 38 is connected to the isolating device 16 and the voltage regulator 26. When the second power switch 38 is activated, a path for the power to the second solenoid 42 through the second high solenoid port 40 is created. When both the second power switch 38 and the ground power switch 36 are activated, current travels through the second solenoid 42, thereby actuating the second solenoid 42. The second solenoid 42 is not actuated unless the second power switch 38 and the ground power switch 36 are both activated. In order to determine the voltage rating of the second solenoid 42, the control logic 28 deactivates the isolating device 16 so it is open. Then, the control logic 28 activates the second power switch 38 and deactivates, or opens, the ground power switch 36. In this manner, the voltage regulator 26, the second power switch 38, the associated second solenoid 42 and the control logic 28 are in series. Since the ground power switch 36 is open, there is no path to the ground port 31.

The controller 10 is capable of determining the voltage rating, an open circuit state, a short circuit state or an out of resistance range state of the first solenoid 32 and the second solenoid 42 in the electropneumatic valve 33. The controller 10 can be connected to multiple electropneumatic valves through additional high solenoid ports and low solenoid ports. Thus, the controller 10 is capable of determining the voltage rating, an open circuit state, a short circuit state or an out of resistance range state of a plurality of solenoids in a plurality of electropneumatic valves connected to the controller 10 of the braking control system on a commercial vehicle. The number of solenoids in each electropneumatic valve may vary dependent on the type electropneumatic valve.

Accordingly, a controller to determine the voltage rating of a solenoid in an electropneumatic valve is disclosed. The controller includes a battery power port, an input for receiving a signal indicative of ignition power and an isolating device electrically connected to the battery power port. The controller also includes a first power switch electrically connected to the isolating device, a first high solenoid port electrically connected to the first power switch and an associated first solenoid, a low solenoid port electrically connected to the associated first solenoid, a voltage regulator electrically connected to the battery power port and the first high solenoid port and control logic. The control logic is electrically connected to the input for receiving a signal indicative of ignition power, the voltage regulator, the first power switch, and the isolating device. The control logic is capable of determining a voltage rating of the associated first solenoid. In another embodiment, the control logic is further capable of determining at least one of an open circuit state, short circuit state or resistance out of range state of the associated first solenoid.

A method to test an electropneumatic valve to ensure that the solenoids in the electropneumatic valve are rated to operate with the battery system on the truck to which it is installed. The method detects installation of an electropneumatic valve that has a rating different than the voltage rating of the controller. The method tests an electropneumatic valve to ensure that the solenoids are not in an open circuit, short circuit or resistance out of range state.

Figure 2:
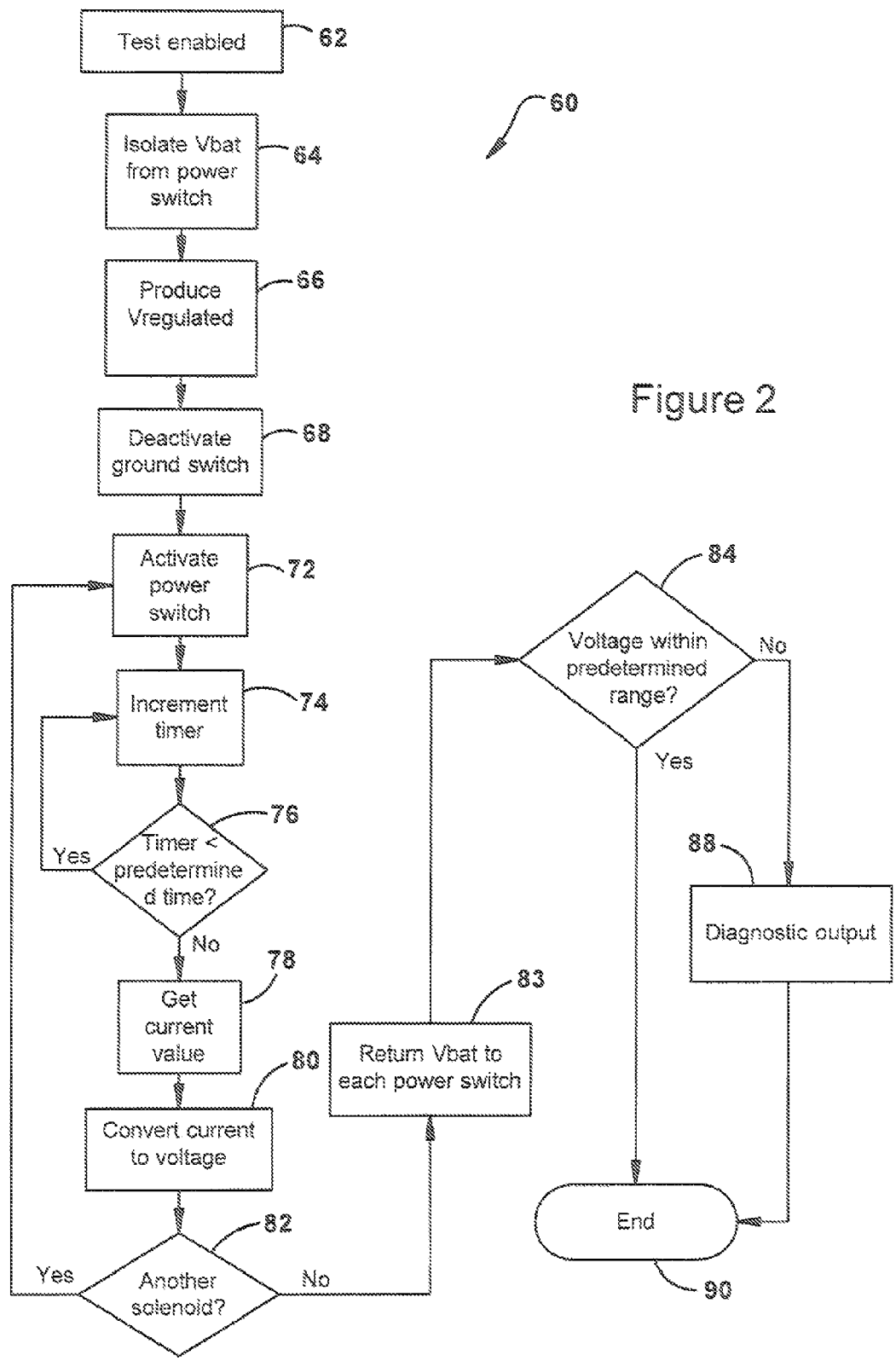
FIG. 2 illustrates a method of implementing the system, according to an embodiment of the present invention.

A flowchart for implementing a method 60 of determining the voltage rating of the solenoid of an embodiment of the present invention is shown in FIG. 2.

First, in step 62, the method 60 is enabled upon receiving ignition power at the ignition power port 14. Alternatively, the method 60 is enabled upon receiving a signal indicative of ignition power at ignition power port 14 or another location, such as from a serial communications bus. Battery power is already present at the battery power port 12. The isolating device 16 is deactivated by the control logic 28 so as to isolate the battery power at the battery power port 12 from the first power switch 18 upon receiving the signal indicative of ignition power at the ignition power port 14 in step 64.

In step 66, the voltage regulator 26 supplies a regulated voltage using the voltage received at the battery power port 14. The voltage regulator 26 is capable of supplying an accurate, steady voltage output based on a battery voltage input of between 8V and 36V. The electrical transients that may be present on the battery voltage are not present on the voltage output of the voltage regulator 26. However, the regulated output of the voltage regulator 26 generally has a low current output, typically lower than 500 mA. Therefore, the current output of the voltage regulator 26 is not enough to actuate the first solenoid 32 to induce movement of the internal solenoid armature to open or close the electropneumatic valve 33 air passages.

In step 68, the ground power switch 36 is deactivated. In this manner, there is not a direct path to the ground port 31 through the ground power switch 36. The first power switch 18 is activated in step 72. Therefore, the regulated voltage from the regulator 26 is provided to the high solenoid port 22 and the first solenoid 32. A current through the first solenoid 22 is received at the low solenoid port 24.

In the control logic 28, a timer is set and incremented in step 74 once the signal indicative of ignition power is received. The first power switch 18 remains activated as long as the timer is less than a predetermined time period. In one instance, the predetermined time period is about 100 milliseconds. Once the timer reaches about 100 milliseconds, the current value at the low solenoid port 24 is captured in step 78 and the first power switch 18 is deactivated.

The converter 30 converts the current value to a voltage value that can be interpreted by the control logic 28 in step 80. In step 82, the control logic 28 determines if there are other solenoids that must be tested. The control logic 28 may be pre-programmed with the number of solenoids that should be connected to the controller 10 or the control logic 28 may poll the circuitry to determine how many power switches are connected and deduce the number of solenoids. Once all of the solenoids are tested and the respective voltage values are received by the control logic 28, the method continues to step 83.

In step 83, the control logic 28 returns the battery voltage to each power switch by activating the isolation device 16. In step 84, the control logic 28 determines the voltage rating of the first solenoid 32 by determining if the voltage received at the control logic 28 is within a predetermined range. The predetermined range may be preprogrammed into the memory of the control logic 28. In one example, the predetermined voltage range for a normally operating solenoid with a voltage rating for 12V operation is between about 0.47V and about 1.25V. In another example, the predetermined voltage range for a normally operating solenoid with a voltage rating for 24V operation is between about 1.4V and about 3.28V. Each ABS manufacturer may have different voltage values due to different solenoid resistance values and/or circuit configuration choices.

In addition, in step 84, the control logic 28 compares the voltage to the preprogrammed range for the voltage rating of a solenoid. If the voltage based on the current through the first solenoid 32 is within the preprogrammed range, then the control logic 28 checks the voltage of the second solenoid 42 of electropneumatic valve 33 to determine if it also has a voltage within the pre-programmed voltage range. Once all of the voltage values from all of the solenoids have been determined to be within the predetermined voltage range, the method ends at step 90.

If the control logic 28 determines in step 84 that one of the voltages from one of the solenoids is not within the predetermined voltage range, the control logic 28 will send a diagnostic output signal to the diagnostic port 34. The diagnostic output signal may turn on a visual indicator, activate a diagnostic display or be in communication with a vehicle data bus. The diagnostic output signal indicates that at least one of the solenoids is not within the predetermined voltage range. The control logic 28 may also inhibit the electropneumatic valve in which the solenoid is located from being operational or the control logic 28 may inhibit operation of the entire antilock braking system or electronic stability system control until the test is run again at the next vehicle ignition cycle.

In addition, a short circuit across the first solenoid 32 can be diagnosed in step 84. If the voltage from first solenoid 32 is not within the first predetermined voltage range for either the 12V or 24V operation, the voltage is compared with a second predetermined voltage range whereas those voltages are indicative of a short circuit across the first solenoid 32. The second predetermined voltage range for a solenoid with a short circuit is between about 4.8V and about 5.2V. In another embodiment, an open circuit across the first solenoid 32 can be diagnosed. If the voltage from first solenoid 32 is not within the first or second predetermined voltage range, the voltage is compared with a third predetermined voltage range whereas those voltages are indicative of an open circuit across the first solenoid 32. The third predetermined voltage range for a solenoid with an open circuit is between 0V and about 0.2V. Alternatively, the control logic 23 can determine if the first solenoid 32 is out of any of the first, second or third preprogrammed voltage ranges and indicate a resistance out of range due to another factor besides an incorrectly rated solenoid, a short circuit or an open circuit.

Accordingly, in one embodiment a method for determining a voltage rating of a solenoid for a braking system comprises receiving battery power at a battery power port of a controller, receiving a signal indicative of ignition power, isolating battery power from a first power switch upon receiving the signal indicative of ignition power, providing a regulated voltage based on the ignition power at the first power switch, activating the first power switch to provide the regulated voltage to a first solenoid through a high solenoid port, receiving a current through the first solenoid at a low solenoid port; and determining the voltage rating of the first solenoid based on the current received at a low solenoid port.

In another embodiment, a system for determining a voltage rating of a solenoid includes the controller 10 connected to at least one electropneumatic valve 33, a battery power source (not shown), and an ignition power source (not shown). The control logic 28 in the controller 10 is capable of determining the voltage rating of the first solenoid 32. In another embodiment the controller may be connected to a plurality of electropneumatic valves and the control logic 28 is capable of determining the voltage rating of the first solenoid 32 and the second solenoid 42 of the electropneumatic valve 33. The number and type of electropneumatic valves depends on the system installed on a commercial vehicle. An antilock braking system typically includes an electropneumatic valve for each wheel end. A stability control system typically includes an electropneumatic valve for each wheel end and an additional electropneumatic valve, such as the ATR-6™ traction relay valve from Bendix Commercial Vehicle Systems LLC, for the front axle, rear axle and trailer.

Accordingly, a system for determining a voltage rating of a solenoid comprises a controller containing control logic; a first solenoid electrically connected to the controller; a battery power source connected to the controller; an input for receiving a signal indicative of ignition power connected to the controller. The control logic is capable of determining a voltage rating of the first solenoid by isolating the battery power source from a first solenoid; providing a regulated voltage to the first solenoid in response to voltage at the ignition power source; receiving a current through the first solenoid; and determining the voltage rating of the first solenoid based on the received current. In another embodiment the controller may be connected to a plurality of electropneumatic valves and the control logic 28 is capable of determining the voltage rating of the first solenoid 32 and the second solenoid 42 of the electropneumatic valve 33.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. A controller for a braking system comprising:
   a battery power port;
   an isolating device electrically connected to the battery power port;
   a first power switch electrically connected to the isolating device;
   a first high solenoid port electrically connected to the first power switch and configured to electrically connect to an associated first solenoid;
   a low solenoid port configured to electrically connect to the associated first solenoid;
   a voltage regulator electrically connected to the battery power port and the first high solenoid port;

control logic electrically connected to the voltage regulator, the first power switch, and the isolating device; wherein the control logic is capable of determining a voltage rating of the associated first solenoid; and a port for receiving a signal indicative of ignition power and the control logic is capable of determining the voltage rating of the associated first solenoid upon receiving the signal indicative of ignition power.

2. The controller as in claim 1, wherein the control logic is programmed with the voltage rating of the controller and the control logic is capable of comparing the voltage rating of the controller with the voltage rating of the associated first solenoid.

3. The controller as in claim 1, wherein the control logic is capable of determining the voltage rating of the associated first solenoid based on a current received at the low solenoid port.

4. The controller as in claim 3, further comprising a converter in communication with the low solenoid port and the control logic, wherein the converter is capable of converting the current received at the low solenoid port to a voltage proportional to the current.

5. The controller as in claim 1, wherein the voltage regulator is capable of providing a regulated voltage based on the voltage at the battery power port.

6. The controller as in claim 5, wherein the voltage regulator is capable of providing less than about 500 mA of current.

7. The controller as in claim 4, further comprising a ground power switch in communication with a ground port, the low solenoid port and the control logic.

8. The controller as in claim 7, wherein the voltage regulator, the first power switch, the associated first solenoid and the converter are electrically connected in series and wherein the ground power switch is deactivated.

9. The controller as in claim 1, further comprising a diagnostic output, wherein the control logic is capable of transmitting a diagnostic output signal.

10. The controller as in claim 1, wherein the isolating device is at least one of a relay and a power switch.

11. The controller as in claim 1, wherein the control logic is further capable of determining at least one of an open circuit state, a short circuit state or a resistance out of range state of the associated first solenoid.

12. The controller as in claim 1 further comprising a second power switch electrically connected to the control logic, the isolating device and a second solenoid high port, wherein the second solenoid high port and the low solenoid port are configured to electrically connect to an associated second solenoid and the control logic is capable of determining a voltage rating of the associated second solenoid.

13. The controller as in claim 12, further comprising a converter electrically connected to the low solenoid port and the control logic, wherein converter is capable of converting a current received at the low solenoid port to a voltage proportional to the current.

14. The controller as in claim 12, further comprising a ground power switch in communication with a ground port, the low solenoid port and the control logic.

15. The controller as in claim 13, wherein the voltage regulator, the second power switch, the associated second solenoid and the converter are electrically connected in series and the ground power switch is deactivated.

16. The controller as in claim 12, wherein the control logic is further capable of determining at least one of an open circuit state, a short circuit state or a resistance out of range state of the associated second solenoid.

17. A method for determining a voltage rating of a solenoid for a braking system comprising:

receiving battery power at a battery power port of a controller;

receiving a signal indicative of ignition power;

disconnecting battery power from a first power switch at an isolation device upon receiving the signal indicative of ignition power;

providing a regulated voltage based on the battery power at the first power switch;

activating the first power switch to provide the regulated voltage to a first solenoid through a high solenoid port;

deactivating a ground switch when the first power switch is activated;

receiving a current through the first solenoid at a low solenoid port; and determining the voltage rating of the first solenoid based on the current received at a low solenoid port.

18. The method as in claim 17, wherein providing the regulated voltage and activating the first power switch occur for a predetermined time period after receiving the signal indicative of ignition power.

19. The method as in claim 18 further comprising deactivating the first power switch when the time period from receiving the ignition power is greater than or equal to the predetermined time period.

20. The method as in claim 19, wherein the predetermined time period is about 100 msec.

21. The method as in claim 17, further comprising converting the received current to a voltage at a converter.

22. The method as in claim 21, wherein determining the voltage rating of the first solenoid comprises comparing the voltage from the converter to a predetermined voltage range.

23. The method as in claim 22, wherein the predetermined voltage ranges from about 1.4 volts to about 3.28 volts for a voltage rating of 24V.

24. The method as in claim 22, wherein the predetermined voltage ranges from about 0.47 volts to about 1.25 volts for a voltage rating of 12V.

25. The method as in claim 22, further comprising transmitting a diagnostic signal when the controller determines the first solenoid is outside the reference voltage range.

26. The method as in claim 17, further comprising determining at least one of an open circuit state, short circuit state or resistance out of range state of the first solenoid, wherein each state has a distinct predetermined voltage range.

27. The method as in claim 17, further comprising activating a second power switch to provide the regulated voltage to a second solenoid and determining the voltage rating of the second solenoid based on the current received at the low solenoid port.

28. The method as in claim 17, further comprising activating the ground switch and connecting battery power and the first power switch at the isolation device prior to determining the voltage rating of the first solenoid.

29. A system for determining a voltage rating of a solenoid comprising:

a controller containing control logic;

a first solenoid electrically connected to the controller;

a battery power source connected to the controller;

an input at the controller for receiving a signal indicative of ignition power;

the control logic capable of determining a voltage rating of the first solenoid, the determining comprising:

isolating the battery power source from the first solenoid;

providing a regulated voltage to the first solenoid in response to the signal indicative of ignition power;

receiving a voltage corresponding to a current through the first solenoid; and determining the voltage rating of the first solenoid based on the received voltage.

30. The system as in claim 29, wherein determining the voltage rating of the first solenoid comprises comparing the voltage at the control logic to a reference voltage range.

31. The system as in claim 30, further comprising a diagnostic device, wherein the control logic is capable of transmitting a signal to the diagnostic device when the controller determines the first solenoid is outside the reference voltage range.

32. The system as in claim 29, further comprising determining at least one of an open circuit state, a short circuit state or a resistance out of range state of the first solenoid.

33. The system as in claim 29, wherein the control logic is further capable of determining a voltage rating of a second solenoid of a plurality of solenoids connected to the controller, the control logic capable of determining the voltage rating of the second solenoid after determining the voltage rating of the first solenoid.

* * * * *